(12) United States Patent
Miyajima

(10) Patent No.: US 6,476,458 B2
(45) Date of Patent: Nov. 5, 2002

(54) SEMICONDUCTOR DEVICE CAPABLE OF ENHANCING A WITHSTAND VOLTAGE AT A PERIPHERAL REGION AROUND AN ELEMENT IN COMPARISON WITH A WITHSTAND VOLTAGE AT THE ELEMENT

(75) Inventor: Takeshi Miyajima, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/994,939

(22) Filed: Nov. 28, 2001

(65) Prior Publication Data

US 2002/0063300 A1 May 30, 2002

(30) Foreign Application Priority Data

Nov. 29, 2000 (JP) .......................... 2000-363036

(51) Int. Cl.⁷ .......................... H01L 23/58; H01L 29/76
(52) U.S. Cl. .................. 257/496; 257/336; 257/337; 257/339; 257/341; 257/488; 257/492; 257/493; 257/494
(58) Field of Search .................. 257/336, 337, 257/339, 341, 488, 490, 491, 492, 493, 494, 496

(56) References Cited

U.S. PATENT DOCUMENTS 4,805,004 A * 2/1989 Gandolfi et al.
5,557,127 A * 9/1996 Ajit et al. .................. 257/339
6,054,748 A 4/2000 Tsukada et al.
6,313,504 B1 * 11/2001 Furuta et al. ............... 257/335

FOREIGN PATENT DOCUMENTS

| JP | A-2-98968 | 4/1990 |
|---|---|---|
| JP | A-8-78668 | 3/1996 |
| JP | A-8-255919 | 10/1996 |
| JP | A-8-306937 | 11/1996 |
| JP | A-9-246549 | 9/1997 |
| JP | A-10-173174 | 6/1998 |
| JP | A-10-321878 | 12/1998 |
| JP | A-11-68085 | 3/1999 |

* cited by examiner

Primary Examiner—Ngân V. Ngô
(74) Attorney, Agent, or Firm—Law Offices of David G. Posz

(57) ABSTRACT

A semiconductor device has an element region including MOS structure. A p-well region, a connecting impurity diffused region, and an impurity diffused region for guard ring are formed in an n-type semiconductor layer so as to form a well region, The well region has a step defining a higher portion and a lower portion lower than the higher portion so that the impurity diffused region for guard ring is located at the lower portion. The lower portion is located at a periphery of the element region. In this structure, the impurity diffused region for guard ring is completely depleted while the connecting impurity diffused region is partially depleted so that a portion having carriers remains therein while a depletion layer expands in the connecting impurity diffused region before a breakdown due to a reverse bias occurs in the element region.

17 Claims, 7 Drawing Sheets

SEMICONDUCTOR DEVICE CAPABLE OF ENHANCING A WITHSTAND VOLTAGE AT A PERIPHERAL REGION AROUND AN ELEMENT IN COMPARISON WITH A WITHSTAND VOLTAGE AT THE ELEMENT

CROSS REFERENCE TO RELATED APPLICATION

This application is based upon Japanese Patent Application No. 2000-363036 filed on Nov. 29, 2000, the contents of which are incorporated herein by reference.

BACKGROUND OF THE INVENTION

1. Field of the Invention

The present invention relates to a semiconductor device, specially, to a structure capable of withstanding high voltage at a periphery of the semiconductor device.

2. Related Art

As shown in FIG. 7, a guard ring 100 is formed around an element region, which has a structure of RESURF in which a semiconductor region corresponding to the guard ring 100 is perfectly depleted before a breakdown occurs. It is found that even if such a epitaxial layer is employed, which has a thickness of such a degree that a design margin is very restricted, the guard ring has a characteristic of high withstand voltage in comparison with a region where transistors are formed when employing the guard ring 100.

However, it is also found that such a problem may occur that when a p-well 200, which is formed to draw holes generated at a periphery portion and is not perfectly depleted in occurring the breakdown, is formed between the guard ring 100 and a transistor-cell region (element region), a withstand voltage at a boundary between the guard ring 100 and the p-well 200 (A1 in FIG. 7) is lowered in rising a potential at a drain region.

SUMMARY OF THE INVENTION

This invention has been conceived in view of the background as described above and an object of the invention is to provide a semiconductor device capable of enhancing a withstand voltage at a peripheral region around an element in comparison with a withstand voltage at the element.

When a voltage applied to the element (a voltage applied between a source and a drain in a case where the element is a MOS transistor) is rising, as described above, an electric field increases at an edge of a well region (p-well) in FIG. 7. This phenomenon deeply relates to a fact that a radius r1 at an edge of a carrier remaining region which is not depleted in the well region is small.

Therefore, the inventor of the present invention supposed that a withstand voltage at a boundary between adjacent regions with each other is prevented from being lowered by enlarging the radius, or curvature at the boundary so as to decrease the electric field.

According to a first aspect of the present invention, at a periphery of an element region formed in a substrate having a first conductive type, an impurity diffused region having a second conductive type is formed as a guard ring, and a connecting region, which has high impurity concentration in comparison with the impurity diffused region and has the same conductive type as the impurity diffused region, is formed adjacent to the impurity diffused region so as to make a boundary with the impurity diffused region. Incidentally, the impurity diffused region and the connecting region are formed in the substrate so as to form pn junctions. Moreover, a step arrangement is formed at a region where the impurity diffused region is formed so that the connecting region is terminated at an edge of the step arrangement. When reverse bias is applied to the pn junctions, a depletion layer is expanded in the impurity diffused region and the connecting region, which defines a carrier remaining region in the connecting region. Moreover, before the reverse bias becomes high to such a degree that the element region breaks down, the impurity diffused region is completely depleted. By employing this structure, a curvature of the carrier remaining region that is defined by the depletion layer is enlarged so that electric field is prevented from increasing at a boundary between the depletion layer and the carrier remaining region.

According to another aspect of the present invention, an impurity diffused region, a connecting region, a step arrangement are formed as described above. Moreover, when the impurity diffused region is fully depleted, a depletion layer expands in the connecting region so that a part of the connecting region remains as a carrier remaining region that has carriers therein, whereby a boundary is formed between the depletion layer and the carrier remaining region in the connecting region. Specifically, the boundary is terminated at a contour of the step arrangement.

Preferably, when such a reverse bias that the impurity diffused region is completely depleted is applied, the boundary formed between the depletion layer and the carrier remaining region in the connecting region is disposed higher than the impurity diffused region, and is terminated at a wall portion of the step arrangement.

Other features and advantages of the present invention will become more apparent from the following detailed description made with reference to the accompanying drawings.

DETAILED DESCRIPTION OF THE PREFERRED EMBODIMENT

Figure 1A:
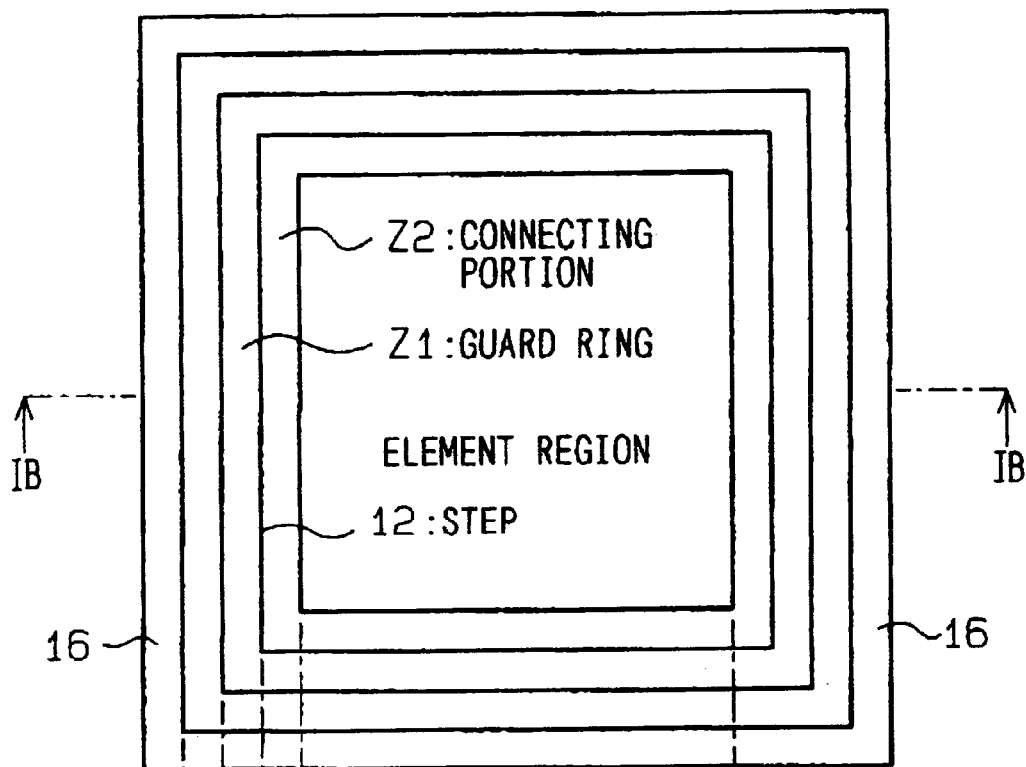
FIG. 1A is a schematic plan view of a semiconductor device in the preferred embodiment of the present invention.
Figure 1B:
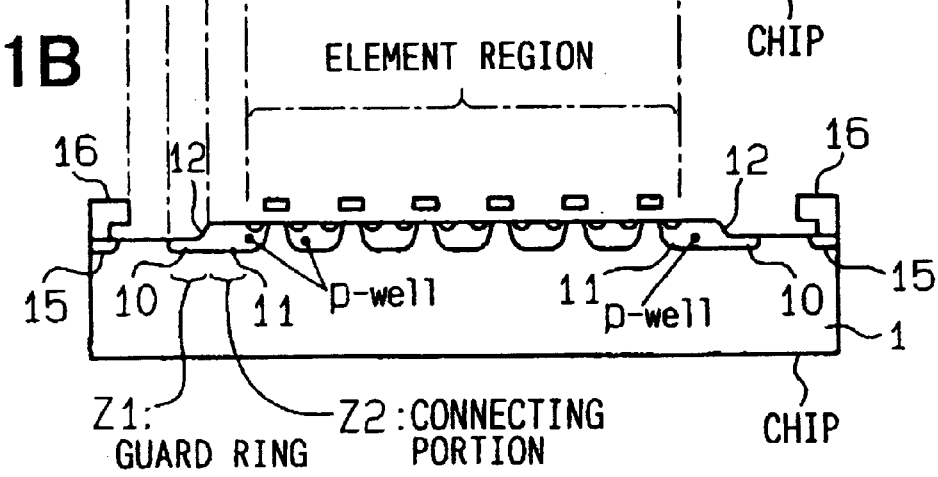
FIG. 1B is a schematic cross sectional view of the semiconductor device taken along line IB—IB in FIG. 1A.

Specific embodiments of the present invention will now be described hereinafter with reference to the accompanying drawings in which the same or similar component parts are designated by the same or similar reference numerals. Incidentally, a semiconductor device is a power MOSFET capable of applying 200V, which is formed in a semiconductor wafer, and divided into each rectangular chip as shown in FIG. 1.

Figure 2:
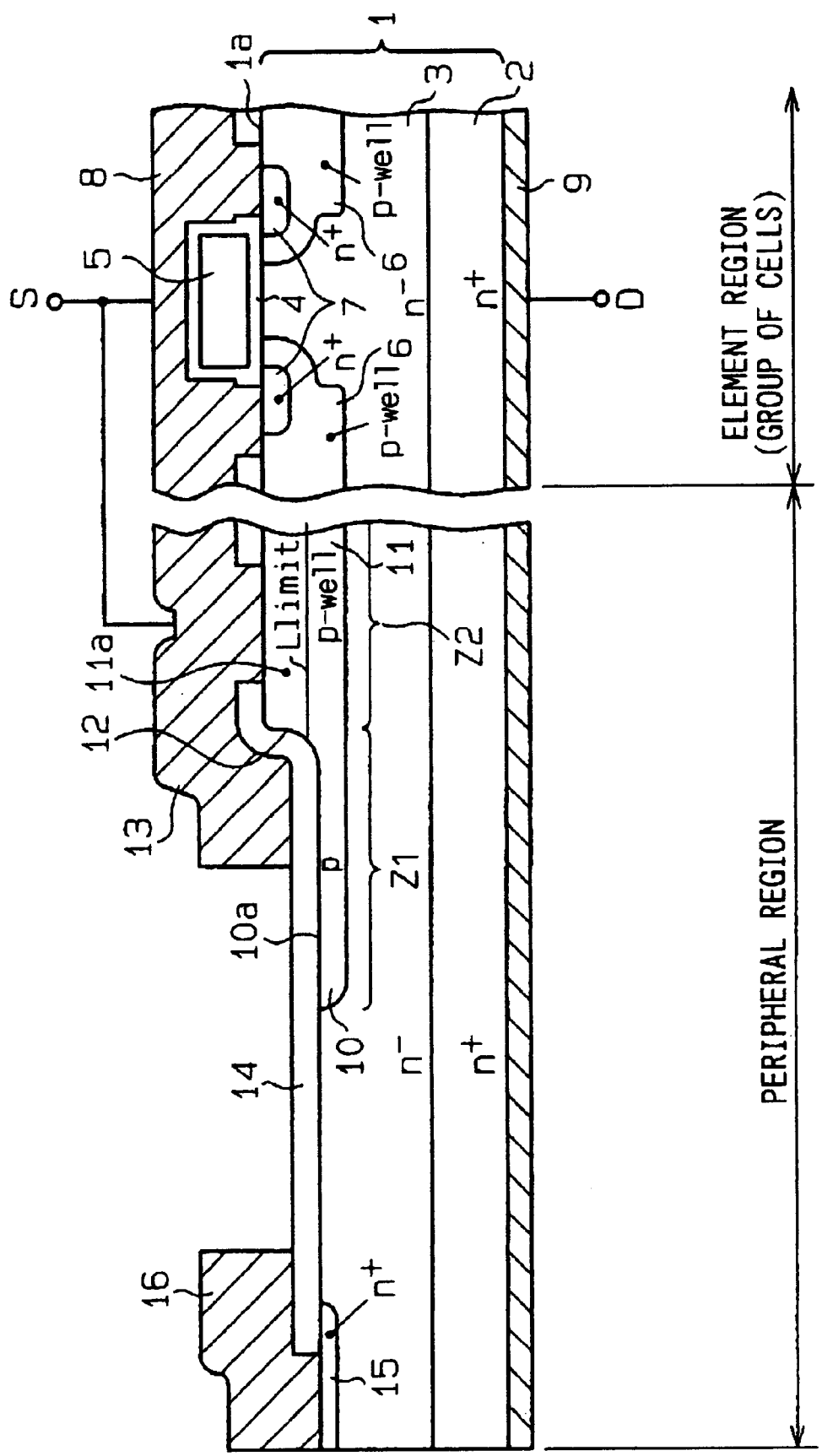
FIG. 2 is a schematic cross sectional view of a main portion of the semiconductor device in the preferred embodiment that relates to the present invention.

As shown in FIG. 2, a substrate having an n⁻ epitaxial layer 3 formed on an n⁺ silicon substrate 2 is employed as a semiconductor substrate 1. In an element region having a plurality of MOSFET cells, a poly-silicon gate electrode 5 is formed on the n⁻ epitaxial layer 3 through a gate oxide film 4. P-well regions 6 are formed at a surface portion of the n⁻ epitaxial layer 3 so that the gate electrode 5 is located therebetween to overlap them. N⁺ regions 7 are formed at surface portions of the p-well regions 6, respectively. A source electrode 8 is formed on the n epitaxial layer 3 so as to contact with the n⁺ regions 7 and the p-well regions 6. Moreover, a drain electrode 9 is formed on a whole area of a back surface of the n⁺ silicon substrate 2.

Further, in a periphery of the element region in the semiconductor substrate 1, a step arrangement 12 is formed at a boundary formed between a guard ring portion Z1 and a connecting portion Z2, so that the periphery portion is located at a lower portion of the step 12 from the boundary in comparison with a wafer standard plane 1a by, for example, 1.5 $\mu$m. In other words, the wafer standard plane 1a becomes a mesa, i.e., is located at a higher portion of the step arrangement 12, which is connected to the lower portion of the step arrangement 12 through a wall portion. A p-type impurity diffused region for guard ring (resurf guard ring) 10 is formed at a lower portion of the step arrangement 12. The p-type impurity diffused region is fully depleted before the element region breaks down. More specifically, a plane density of impurity in the impurity diffused region 10 is approximately at $1 \times 10^{12}/cm^2$. A depth of the impurity diffused region 10 is 2.5 $\mu$m, for example.

Moreover, a connecting impurity diffused region (p-well region) 11 is formed at higher portion of the step arrangement 2. More specifically, the connecting impurity diffused region 11 is formed at the surface portion of the substrate 1 so as to be located between the p-well region 6 and the p-type impurity diffused region for guard ring 10 to connect them. The connecting impurity diffused region 11 has an impurity concentration higher than that of the impurity diffused region for guard ring 10 so as not to be fully depleted when the element region breaks down. More specifically, a plane density of impurity in the connecting impurity diffused region 11 is at a degree more than $1 \times 10^{12}/cm^2$. Moreover, an upper limit side L-limit of a depletion layer expanding in the connecting impurity diffused region 11 is higher than a principal surface of the impurity guard ring 10a. The upper limit side L-limit of the depletion layer is disposed at such a level that the depletion layer is capable of reaching in the connecting impurity diffused region when a breakdown due to a reverse bias occurs at the element region. Incidentally, the impurity diffused region for guard ring 10 is not fully depleted and the upper limit side L-limit of the depletion layer is lower than the upper surface 10a of the impurity diffused region for guard ring 10 when the power MOSFET is not activated and high reverse bias is not applied between the source and drain.

Furthermore, a metallic field plate, which is, for example, applied the same potential as that of the source electrode, is formed on the connecting impurity diffused region 11 (p-well region) and the p-type impurity diffused region for guard ring 10 (resurf guard ring) through an insulator film 14 so as to cover the step arrangement 12 and be extended to a predetermined portion of the impurity diffused region for guard ring 10. An n⁺ region for EQR (EQual potential Ring) 15 is formed on the substrate 1 at a peripheral end portion of a chip, and is connected to an EQR electrode 16.

Incidentally, the field plate may be composed of a conductive material such as poly-silicon or the like, and may be controlled by gate potential.

Figure 3:
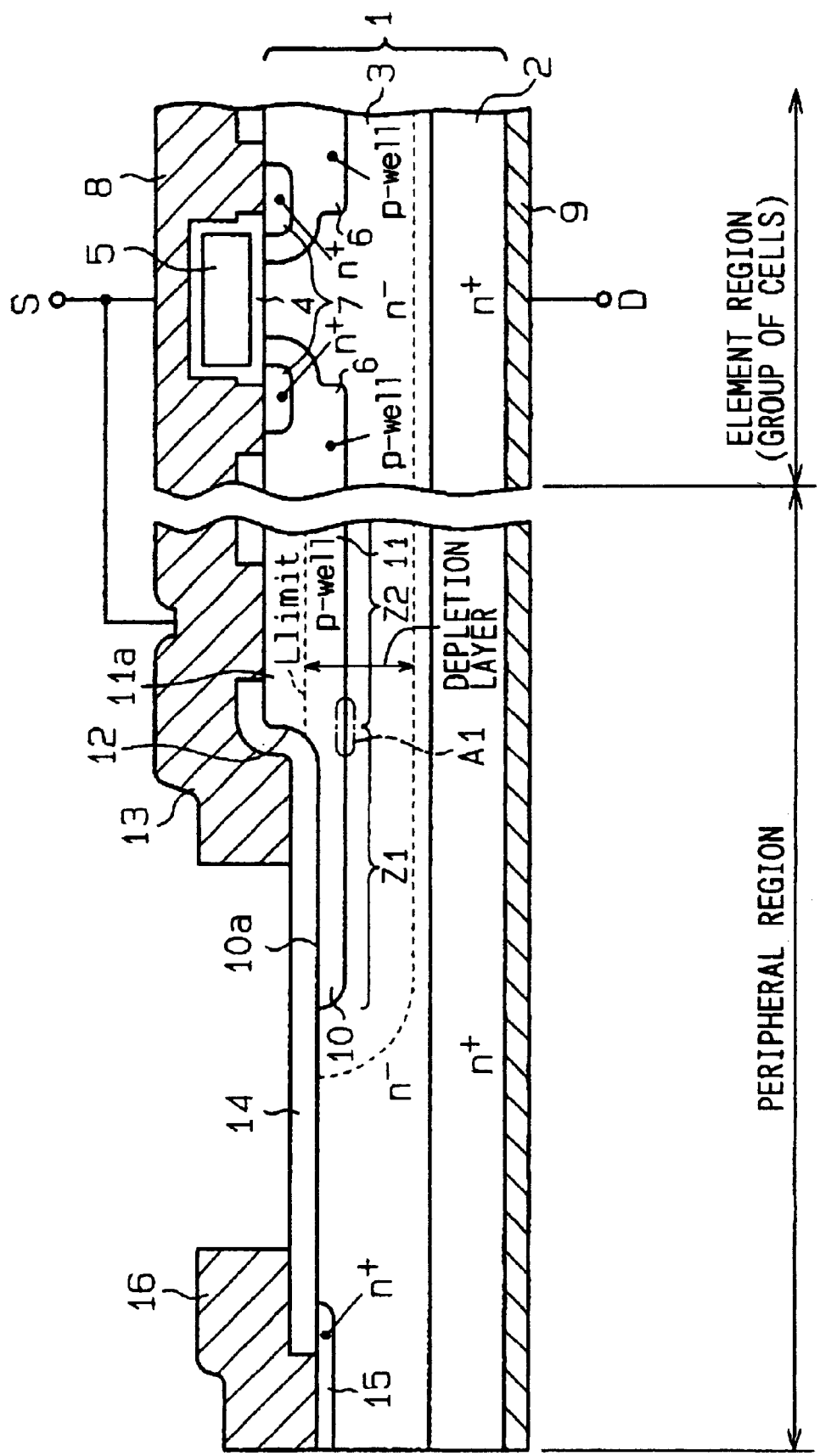
FIG. 3 is a schematic cross sectional view of the main portion of the semiconductor device in the preferred embodiment when a voltage is applied.

The depletion layer expands when a drain potential at the drain electrode 9 rises as shown in FIG. 3. When the potential at the drain electrode 9 rises, the connecting impurity diffused region (p-well region) 11 is partially depleted so that holes remain at a region 11a that is not depleted in the connecting impurity diffused region 11. Hereinafter, the region 11a is referred to as a carrier remaining region 11a.

Figure 7:
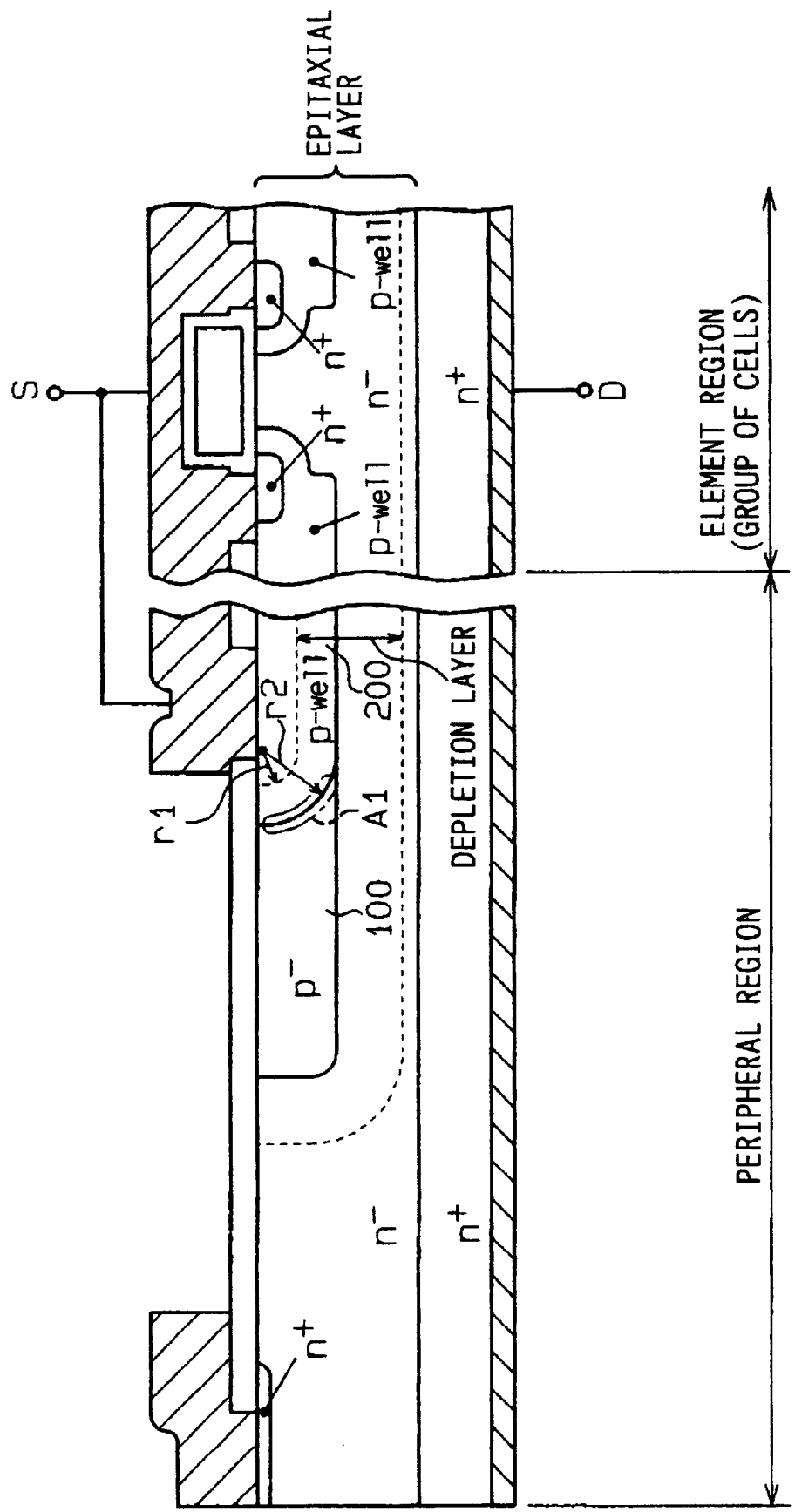
FIG. 7 is a schematic cross sectional view of a semiconductor device in the related art.

In the structure shown in FIG. 7, the carrier remaining portion in the connecting region (p-well) 200 that is not depleted forms a rounded edge to have the radius r1 when a voltage applied between a source and a drain rises by increase of the drain potential in the MOSFET. On the other hand, in the present embodiment, the upper surface 10a of the impurity diffused region for guard ring 10 is formed lower than the upper limit side L-limit that denotes the upper limit of depletion in the connecting impurity diffused region by the step arrangement 12 so that the remaining portion in the connecting impurity diffused region that is not depleted is terminated at an edge of the step arrangement 12. As a result, the radius r1 at an end portion of the carrier remaining portion 11a is enlarged (the radius r1 in FIG. 3 becomes almost infinite) to prevent an electric field from increasing at the end portion of the carrier remaining portion. Therefore, the withstand voltage is prevented from being lowered in this MOSFET with the structure described above.

Moreover, when the n⁻ epitaxial layer 3 is designed so as to be thin to such a degree that a necessary withstand voltage is secured at the element region, each withstand voltage at the element region, the guard ring and the connecting region 200 (the connecting impurity diffused region 11 in this embodiment) will have a relationship with each other as described below.

In the Structure Shown in FIG. 7:
    WSV at G.R. 100>WSV at C.R. 200=WSV at E.R.
In the Structure in this Embodiment:
    WSV at G.R. Z1>WSV at C.R. Z2>WSV at E.R.

Where WSV denotes withstand voltage, G.R. denotes guard ring, C.R. denotes connecting region, E.R. denotes element region. As described above, the withstand voltage at the periphery of the element region can be enhanced with respect to that of the element region, so that the epitaxial layer 3 can be thinned so as to lower an on-resistance in a MOS structure (on-voltage in an IGBT structure) while the withstand voltage is kept at high level. Therefore, the device structure described above can achieve a balance between a low on-resistance and a high capacity of a surge.

Incidentally, a lower limit side of the depletion layer may reach the n⁺ silicon substrate 2.

Next, a manufacturing method for producing the power MOSFET will be described below with reference to FIGS. 4 through 6, and 2.

Figure 4:
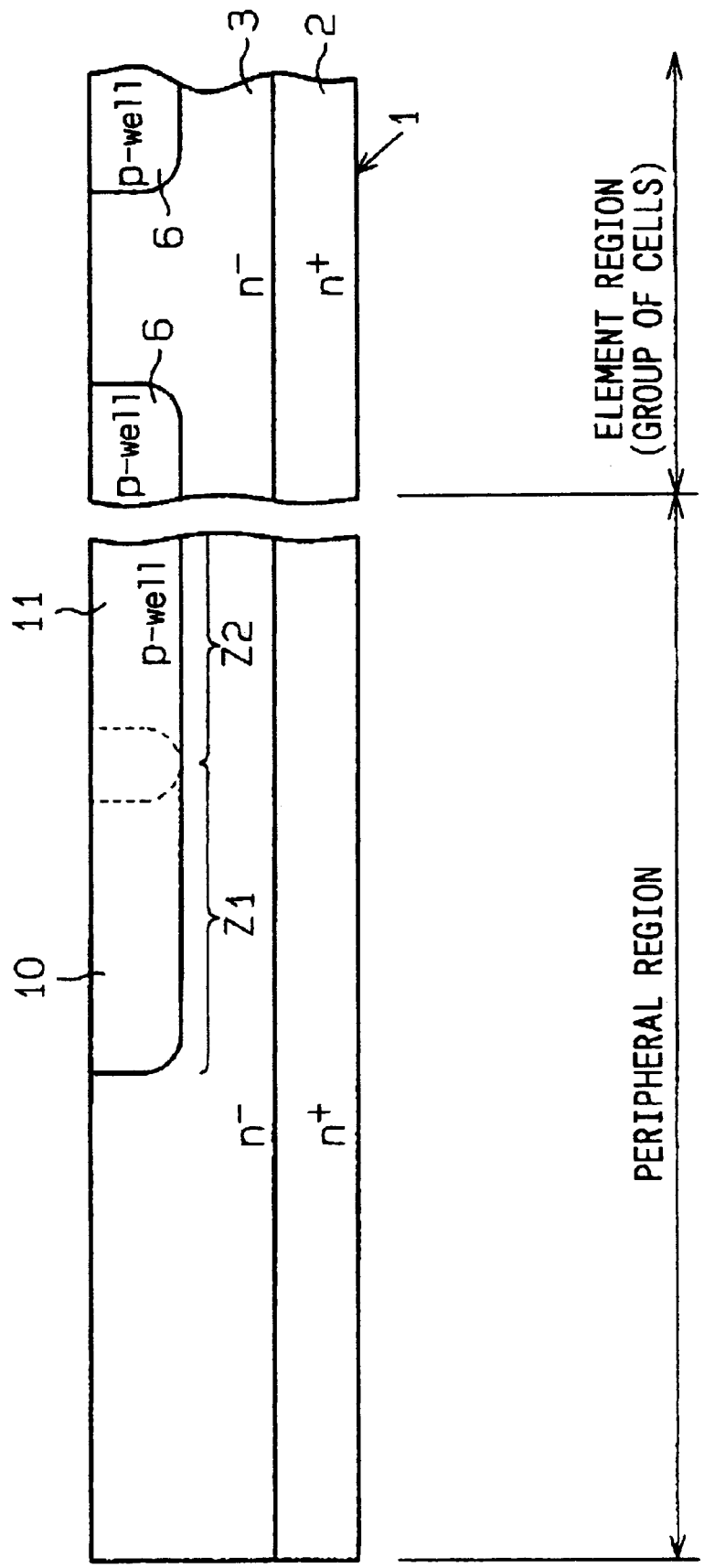
FIG. 4 is a schematic cross sectional view of the semiconductor device to explain a manufacturing method of the same in the preferred embodiment of the present invention.
Figure 5:
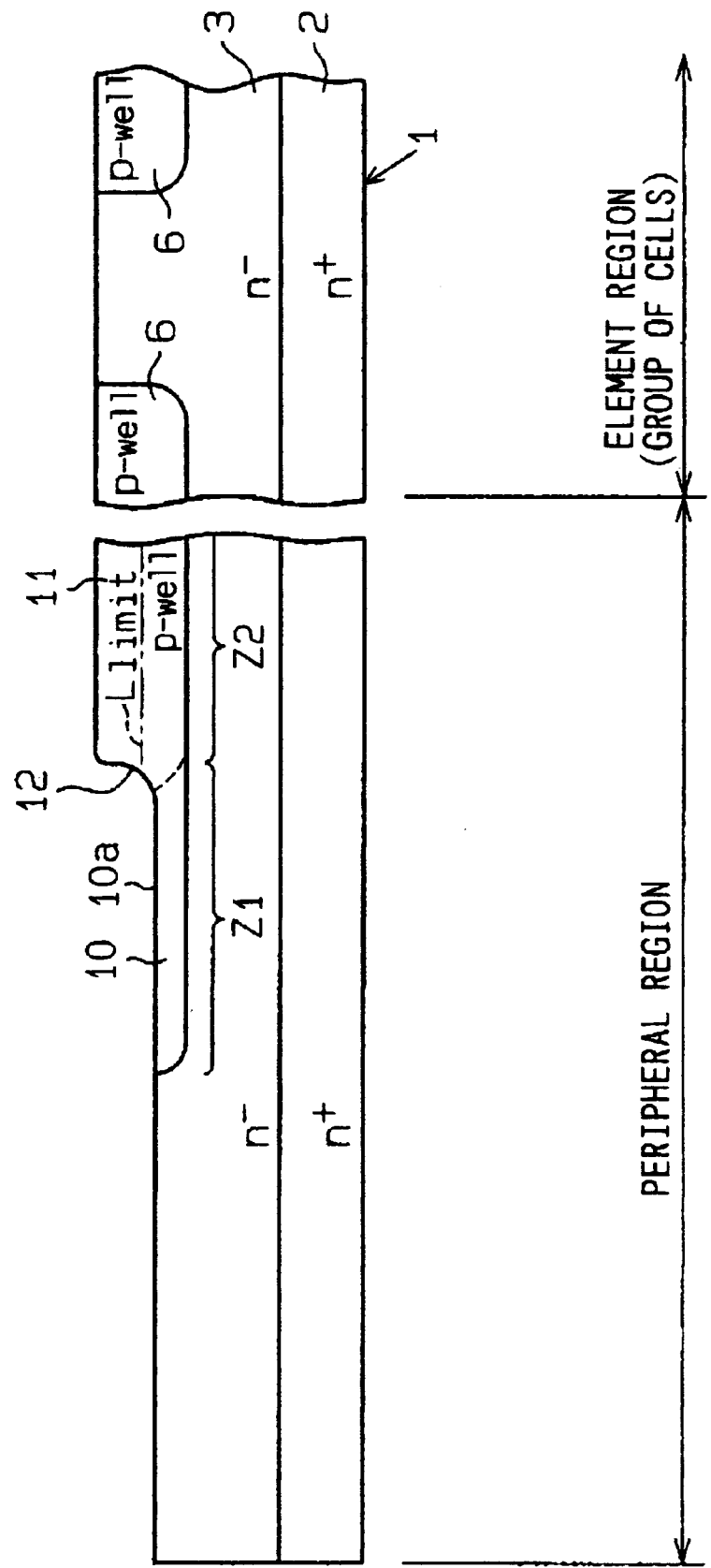
FIG. 5 is a schematic cross sectional view of the semiconductor device to explain a manufacturing method of the same in the preferred embodiment of the present invention.
Figure 6:
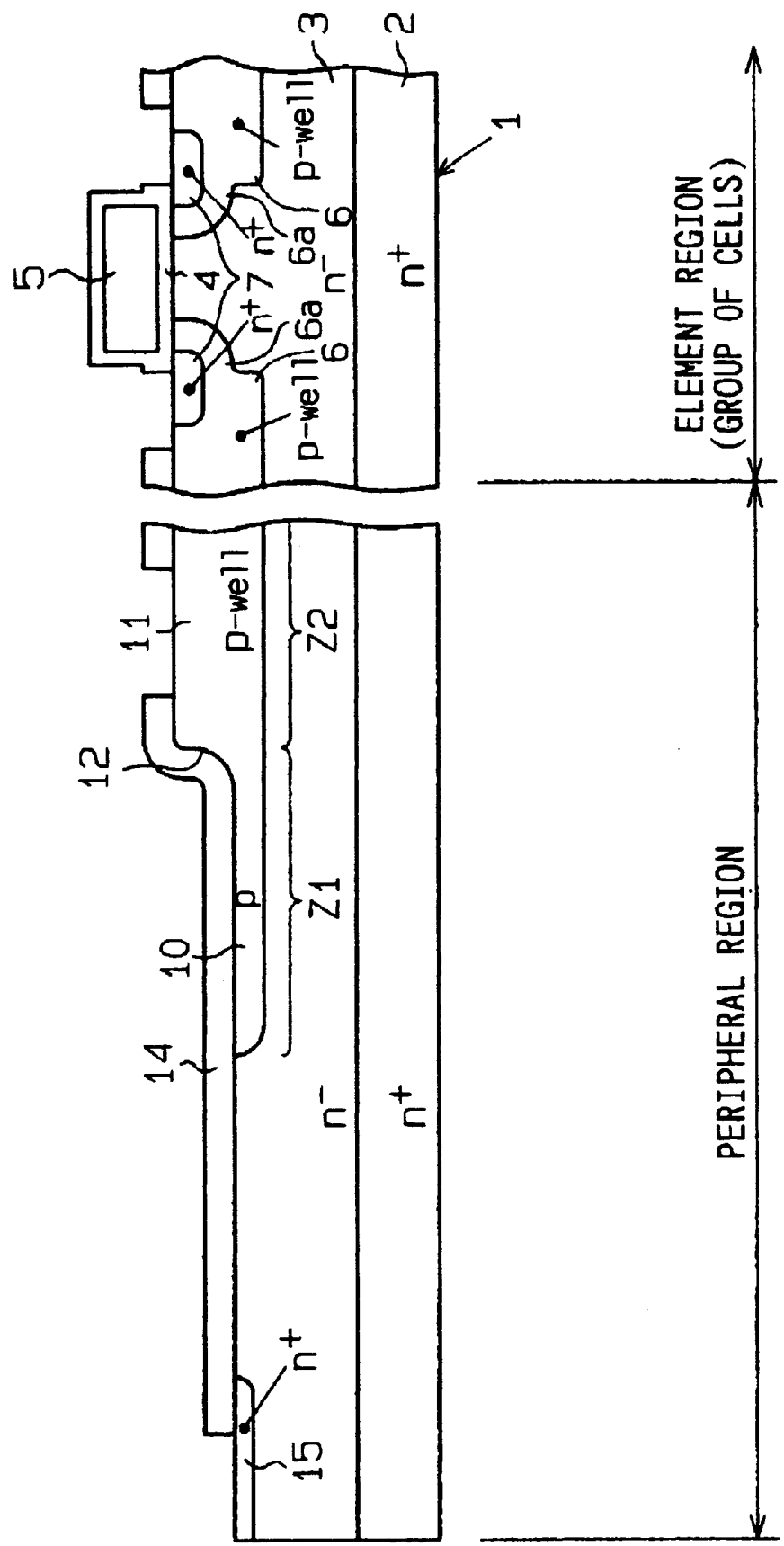
FIG. 6 is a schematic cross sectional view of the semiconductor device to explain a manufacturing method of the same in the preferred embodiment of the present invention.

First, the semiconductor substrate 1 is prepared so that the n⁻ epitaxial layer 3 is formed on the n⁺ silicon substrate 2. The p-well regions 6, an impurity diffused region 10 and the connecting impurity diffused region 11 are formed at the surface portion of the n⁻ epitaxial layer 3 as shown in FIG. 4. Specifically, one of p well regions 6 and the connecting impurity diffused region 11 are connected through the impurity diffused region 10 to form a well region. To form them, p type impurity ions such as boron (B+) are implanted into the n epitaxial layer 3, and the substrate 1 is subjected to a thermal process to diffuse the implanted ions into the n⁻ epitaxial layer 3. Then, as shown in FIG. 5, the step arrangement 12 is formed on the upper side of the substrate 1. As a result, the impurity diffused region for guard ring 10 is formed so that the upper surface 10a thereof is lowered in comparison with a principal surface of the connecting impurity diffused region 11.

An etching (wet or dry) or an oxidation can be employed to form the step arrangement 12. Incidentally, an oxide film may be formed by the so-called LOCOS (LOCal Oxidation of Silicon) process in which a nitride film is employed as a mask so as to form a thick oxide film at a region where is not covered by the nitride film.

A formation of the impurity diffused region for guard ring 10 will be described. First, the impurity diffused region for guard ring 10 is formed by forming an impurity region at a portion to be the impurity diffused region 11 including containing a portion for the impurity diffused region for guard ring 10 and forming the step arrangement 12. More specifically, by the etching or oxidizing the surface portion of the impurity diffused region 11, the impurity diffused region for guard ring 10 having a low impurity concentration is automatically formed because an impurity diffused region generally has an concentration profile in a depth direction of a substrate that decreases as the depth in the substrate increases. That is, after the etching or oxidizing, an impurity concentration at the surface portion of the impurity diffused region for guard ring 10 is lower than that at the surface portion of the connecting impurity diffused region Preferably, the impurity diffused region 10 shown in FIG. 4 and the region 11 are formed at an individual step, respectively, so that the impurity concentration in the impurity diffused region 10 is surly lowered in comparison with that in the region 11. For example, the impurity diffused region for guard ring 10 shown in FIG. 4 may be formed after the connecting impurity diffused region 11 is formed, and then the step arrangement 12 is formed by etching or oxidizing. Ion implantation or the like is employed to form them. In this case, the communicating impurity diffused region 11 is not terminated at the higher portion of the step arrangement 12, i.e., at the wafer standard plane 1a, but is terminated at the wall or lower portion of the step arrangement 12 as shown in FIG. 5. This termination causes an increase of the curvature or radius of the carrier remaining region in the connecting impurity diffused region 11. In this figure, although the wall portion is a riser of the step 12, the wall may be an angled riser. This angled riser may be formed by forming the LOCOS film.

Alternatively, after the impurity diffused region 10 and the region 11 are formed at the individual step as shown in FIG. 4, the step arrangement 12 is formed 60 that the plane density of impurity in the impurity diffused region for guard ring 10 shown in FIG. 2 is controlled by an etching or oxidation to such a degree that the impurity diffused region for guard ring 10 can be fully depleted when the element region breaks down.

As described above, the step arrangement 12 is formed at the boundary formed between the impurity diffused region 10 and the connecting impurity diffused region 11. Moreover, the impurity concentration and a thickness of the impurity diffused region for guard ring 10 are controlled to such a degree that the impurity diffused region for guard ring 10 is fully depleted and the upper limit side L-limit of the connecting impurity diffused region 11 becomes high with respect to the upper surface of the impurity diffused region for guard ring 10 when the element region breaks down.

After the step arrangement 12 is formed, the poly-silicon gate electrode 5 are formed on the gate oxide film 4, and element p-well regions 6a are formed at the surface portion of the n epitaxial layer 3. Further, the n⁺ regions 7 are formed at surface portions of the element p-well regions 6a and the n⁺ region 15 is formed in the peripheral portion of the element region. Then, the oxide film 14 is formed on the substrate 1, and contact holes are formed at the predetermined regions in the oxide film 14.

Then, as shown in FIG. 2, the source electrode 8 is formed on the n⁻ epitaxial layer 3 at the element region, and the electrode 13 is formed on the n⁻ epitaxial layer 3 to cover the step arrangement 12 and to be formed on the oxide film 14 so that the electrode 13 contacts with the connecting impurity diffused region 11 and that the electrode 13 on the oxide film 14 works as the field plate. Namely, after the step arrangement 12 is formed, the field plate 13 is extended from the element region to at least the step arrangement 12 when the field plate 13 is formed on the oxide film 14. Further, the electrode 16 is formed at the peripheral region of the element region. Furthermore, the drain electrode 9 is formed at the back surface of the n⁺ silicon substrate 2.

Incidentally, the field plate 13 is composed of poly-silicon that is extended to the peripheral region.

By employing the features described above, if the features in this embodiment described above are explained with the structure shown in FIG. 7 as the related art, the radiuses r1 showing the curvature of the p-well 200 and r2 showing the curvature of the depletion layer are enlarged so that the withstand voltage at the boundary between the p-well 200 and the is guard ring 100 is enhanced.

Moreover, the concentration of the electric field can be relieved by employing the field plate 13 that is extended from the element region to at least the step arrangement 12.

Incidentally, the type of conductivity in each region may be changed to the other type. Further, although a structure of the gate electrode in this embodiment is a planer type, a concave gate structure or a trench gate structure also may be employed. Furthermore, as a type of the cell in the substrate, IGBT or the like may be employed.

While the present invention has been shown and described with reference to the foregoing preferred embodiment, it will be apparent to those skilled in the art that changes in form and detail may be therein without departing from the scope of the invention as defined in the appended claims.

What is claimed is:

1. A semiconductor device comprising:

an element region formed on a substrate;

an impurity diffused guard ring formed at a periphery of the element region in the substrate, and being designed so as to be completely depleted before a breakdown occurs at the element region;

a connecting impurity diffused region formed between the impurity diffused guard ring and the element region so as to connect the impurity diffused guard ring to the element region, the connecting impurity diffused region having a higher impurity concentration in comparison with the impurity diffused guard ring, and the connecting impurity diffused region being not completely depleted at a surface portion thereof when the breakdown occurs at the cell region; and a step formed approximately at a boundary portion that is formed between the impurity diffused guard ring and the connecting impurity diffused region, the step having a lower portion and a higher portion higher than the lower portion so that the impurity diffused guard ring is located at the lower portion and the connecting impurity diffused region is located at the higher portion, wherein:

an upper limit side of a depletion layer expanding in the connecting impurity diffused region is higher than a principal surface of the impurity guard ring, the upper limit side is disposed at such a level that the depletion layer is capable of reaching in the connecting impurity diffused region, and the connecting impurity diffused region is terminated at a wall of the step that is interposed between the lower portion and higher portion of the step.

2. A semiconductor device according to claim 1, further comprising a field plate extended from the element region to the step.

3. A semiconductor device comprising:

an element region formed on a substrate having a semiconductor layer with a first conductivity;

a guard ring region with a second conductivity formed in the semiconductor layer, located at a periphery of the element region;

a connecting region with the second conductivity formed in the semiconductor layer so as to contact with the guard ring region, the connecting region having higher impurity concentration in comparison with the guard ring region, and the connecting region being not completely depleted at a surface portion thereof when the breakdown occurs at the cell region;

an electrode contacting with the connecting region, for applying a reverse bias to a pn junction formed between a portion with the first conductivity and a portion with the second conductivity in the substrate, wherein when the reverse bias is applied to the pn junction, the guard ring region is completely depleted while the connecting region is partially depleted so as to form a depletion portion and a carrier remaining portion disposed on the depletion region; and a step formed at a surface portion of the substrate so as to terminate an upper limit side of the depletion portion at a contour thereof which is disposed lower than a standard plane of the substrate.

4. A semiconductor device comprising:

a substrate having a semiconductor layer with a first conductivity, defining an element region and a peripheral region surrounding the element region therein;

a well region with a second conductivity formed in the semiconductor layer, extending from the element region to the peripheral region, having a step at a side of the peripheral region so that a surface of the well region is partially lowered in comparison with a standard plane of the substrate.

5. A semiconductor device according to claim 4, further comprising an electrode contacting with a higher portion in the well region that is defined by the step.

6. A semiconductor device according to claim 5, wherein a depletion layer expands in the well region so that boundary between the depletion layer and a non-depleted layer is terminated at a wall portion of the step.

7. A semiconductor device according to claim 5, wherein the electrode extends to a lower portion in the well region that is defined by the step.

8. A semiconductor device according to claim 6, wherein the electrode extends to a lower portion in the well region that is defined by the step.

9. A semiconductor device according to claim 7, the electrode does not extend to an outer of the well region.

10. A semiconductor device according to claim 8, the electrode does not extend to an outer of the well region.

11. A semiconductor device according to claim 5, wherein an upper limit side of a depletion layer expanding in the well region is higher than a lowered surface of the well region.

12. A semiconductor device according to claim 11, wherein a height of the step is larger than a depth of a remaining region in the well region that is defined by the depletion layer.

13. A semiconductor device comprising:

a substrate;

a cell region formed on the substrate, acting as a device and having well regions therein that have a second conductive type;

a guard ring region formed at a periphery of the cell region in the substrate, having the second conductive type so as to define a pn junction with the substrate;

a connecting region located between the guard ring region and at least one of the well regions so as to connect the guard ring region to the at least one of the well regions, the connecting region having the second conductive type;

a step formed approximately at a boundary portion that is formed between the guard ring region and the connecting region so that the impurity diffused guard ring is disposed at a lower portion thereof and the connecting impurity diffused region is disposed at a higher portion that is higher than the lower portion with a wall portion interposed therebetween so that the guard ring region is located at the lower portion.

14. A semiconductor device according to claim 13, wherein:

when such a reverse bias that a breakdown occurs in the cell region is applied between the well regions and the substrate, the guard ring region is completely depleted while the connecting region is partially depleted so that an upper limit of a depletion layer expanding in the connecting region becomes higher than a principal surface of the guard ring region.

15. A semiconductor device according to claim 13, wherein the connecting region is terminated at one of the wall portion and the lower portion of the step.

16. A semiconductor device according to claim 13, wherein the lower portion of the step extends to an end of the substrate.

17. A semiconductor device according to claim 13, wherein the guard ring region, the connecting region and the at least one of the well regions form a wide well region having the second conductive type and a predetermined width, the wide well region has a low land where the guard ring portion is located and a high land where the connecting portion and the at least one of the well regions are located, wherein the lowland and highland are caused by the step, and a width of the lowland is narrower than that of the highland.

* * * * *